(12) United States Patent
Väisänen

(10) Patent No.: US 8,126,421 B2
(45) Date of Patent: Feb. 28, 2012

(54) RADIO RECEIVER

(75) Inventor: Risto Väisänen, Salo (FI)

(73) Assignee: Nokia Corporation, Espoo (FI)

( * ) Notice: Subject to any disclaimer, the term of this patent is extended or adjusted under 35 U.S.C. 154(b) by 370 days.

(21) Appl. No.: 12/453,392

(22) Filed: May 8, 2009

(65) Prior Publication Data

US 2010/0167682 A1 Jul. 1, 2010

(30) Foreign Application Priority Data

Dec. 30, 2008 (FI) .................................... 20086252

(51) Int. Cl.
*H04B 1/18* (2006.01)
(52) U.S. Cl. ..................................... 455/313
(58) Field of Classification Search .......... 455/313–319, 455/323, 326, 255, 258, 260, 265
See application file for complete search history.

(56) References Cited

U.S. PATENT DOCUMENTS

2005/0090213 A1  4/2005  Heng et al.

FOREIGN PATENT DOCUMENTS

EP  0 305 603 A1  3/1989
WO  99/01933 A2  1/1999

OTHER PUBLICATIONS

International Search Report application No. PCT/IB2009/007919 mailed Jun. 29, 2010.

*Primary Examiner* — Stephen Jones
(74) *Attorney, Agent, or Firm* — Squire Sanders (US) LLP

(57) ABSTRACT

An apparatus configured to separate from a received radio frequency (RF) signal a first low-frequency signal and a second low-frequency signal having different phases, up-convert the first low-frequency signal and the second low-frequency signal into a first intermediate frequency signal and a second intermediate frequency signal, respectively, and amplify the first and the second intermediate-frequency signals.

18 Claims, 3 Drawing Sheets

RADIO RECEIVER

BACKGROUND

1. Field

The present invention relates to radio receivers and more specifically to filtering received signals in radio receivers.

2. Description of the Related Art

The following description of background art may include insights, discoveries, understandings or disclosures, or associations together with disclosures not known to the relevant art prior to the present invention but provided by the invention. Some such contributions of the invention may be specifically pointed out below, whereas other such contributions of the invention will be apparent from their context.

Radio receivers may down convert a desired channel from an RF signal to a baseband frequency. The received RF signal may have unwanted frequencies, noise and interference, for example, that should be removed or attenuated to provide a signal with sufficient quality on the baseband frequency.

Also the radio receiver itself may cause noise to the received RF signal. This may be due to the type of integrated circuits used in the radio receiver or their quality. However, even with high quality integrated circuits noise may be introduced to the received RF signal if the operational voltage of the circuit is too low.

In radio devices that include many types of radios, for example a mobile phone with Bluetooth, WLAN (Wireless Local Area Network), GSM (Global System for Mobile Communications) and 3G (Third Generation Mobile Communications), the different radios may cause interference to each other.

Because many radio receivers are battery-powered, such as mobile phones, the power consumption of the radio receiver should be kept at an acceptable level. One factor affecting the power consumption of the radio receiver is the number of mixers that are used to mix the received RF signal. However, the power consumption may become high when a high number of mixers are provided a local oscillator signal. Furthermore, because of the several mixers that are interconnected, the pulse ratios of the local oscillator signals may need to be low so that the phases of the local oscillator signals to each mixer do not overlap.

SUMMARY

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

Various embodiments of the invention comprise method(s), apparatus(es) and a computer program as defined in the independent claims. Further embodiments of the invention are disclosed in the dependent claims.

According to an aspect of the invention there is provided an apparatus configured to separate from a received radio frequency (RF) signal a first low-frequency signal and a second low-frequency signal having different phases, up-convert the first low-frequency signal and the second low-frequency signal into a first intermediate frequency signal and a second intermediate frequency signal, respectively, and amplify the first and the second intermediate-frequency signals.

According to a further aspect of the invention the apparatus is configured to down-convert the amplified first and second intermediate-frequency signals into a third low-frequency signal and a fourth low-frequency signal, respectively.

According to a further aspect of the invention, wherein the received RF signal comprises a first frequency band signal and a second frequency band signal, the apparatus is configured to selectively down-convert one of said first and second frequency band signals into said first and said second low-frequency signal.

According to another aspect of the invention there is provided a method comprising separating from a received radio frequency (RF) signal a first low-frequency signal and a second low-frequency signal having different phases, up-converting the first low-frequency signal and the second low-frequency signal into a first intermediate frequency signal and a second intermediate frequency signal respectively, amplifying the first and the second intermediate-frequency signals.

According to another aspect of the invention there is provided a computer program product readable by a computer and encoding a computer program of instructions for executing a method comprising separating from a received radio frequency (RF) signal a first low-frequency signal and a second low-frequency signal having different phases, up-converting the first low-frequency signal and the second low-frequency signal into a first intermediate frequency signal and a second intermediate frequency signal respectively, amplifying the first and the second intermediate-frequency signals.

According to a further aspect of the invention the method comprises down-converting the first and second amplified intermediate-frequency signals into a third low-frequency signal and a fourth low-frequency signal, respectively.

According to a further aspect of the invention wherein the received RF signal comprises a first frequency band signal and a second frequency band signal, the method comprises selectively down-converting one of said first and second frequency band signals into said first and said second low-frequency signal.

Although the various aspects, embodiments and features of the invention are recited independently, it should be appreciated that all combinations of the various aspects, embodiments and features of the invention are possible and within the scope of the present invention as claimed.

BRIEF DESCRIPTION OF THE DRAWINGS

In the following the invention will be described in greater detail by means of exemplary embodiments with reference to the attached drawings, in which.

DETAILED DESCRIPTION OF THE PREFERRED EMBODIMENT(S)

Figure 1:
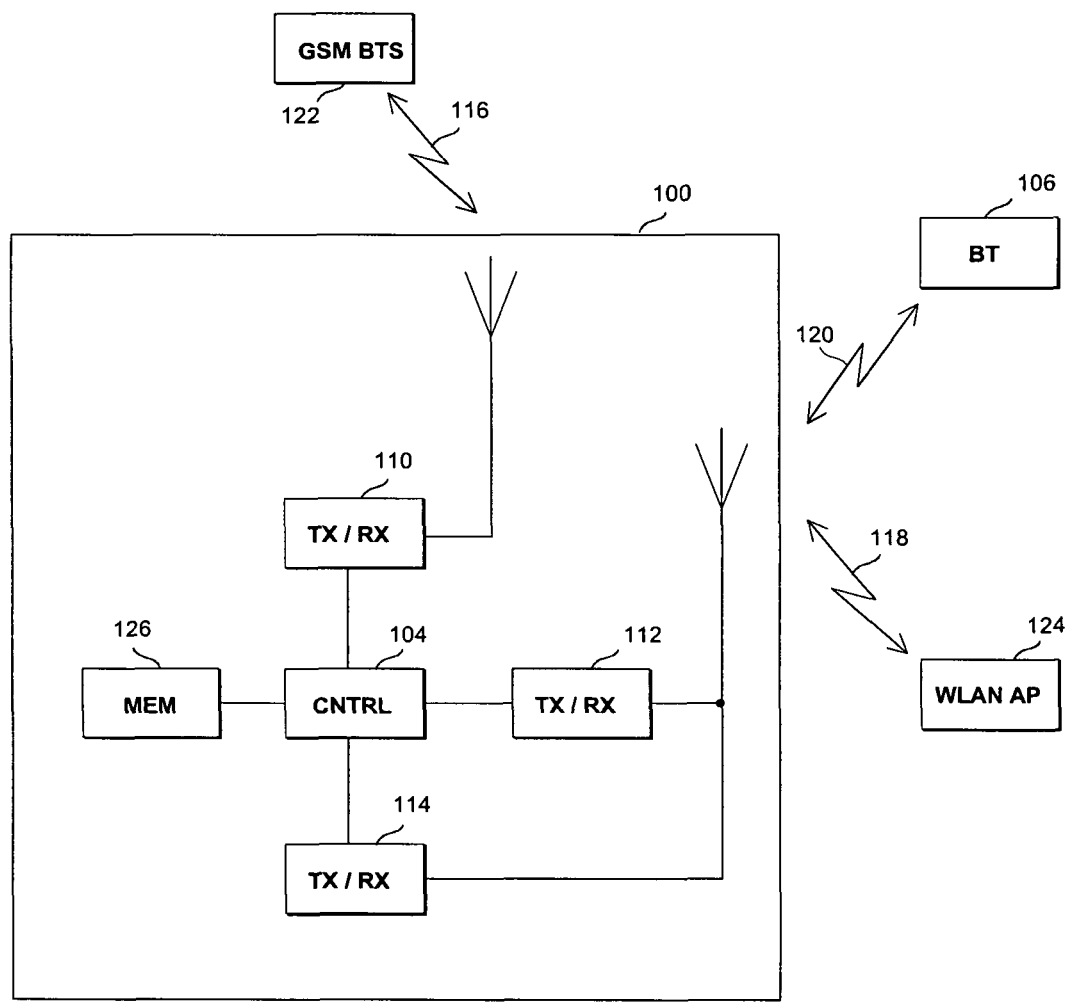
FIG. 1 illustrates an exemplary block diagram of an apparatus according to an embodiment of the invention.

Exemplary embodiments of the present invention will now be described more fully hereinafter with reference to the accompanying drawings, in which some, but not all embodiments of the invention are shown. Indeed, the invention may be embodied in many different forms and should not be construed as limited to the embodiments set forth herein;

rather, these embodiments are provided so that this disclosure will satisfy applicable legal requirements. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments. Like reference numerals refer to like elements throughout.

The present invention is applicable to any receiver, user terminal, base station, access point, corresponding component, and/or to any communication system or any combination of different communication systems that receive RF signals. The communication system may be a fixed communication system or a wireless communication system or a communication system utilizing both fixed networks and wireless networks. The protocols used, the specifications of communication systems, transmitters, user terminals, base stations and access points, especially in wireless communication, develop rapidly. Such development may require extra changes to an embodiment. Therefore, all words and expressions should be interpreted broadly and they are intended to illustrate, not to restrict, the embodiment.

Embodiments of the present invention may be implemented in various devices and systems that receive radio signals such as handheld and infrastructure communications devices. Examples of the devices comprise user equipment (UE), mobile phones, base stations, Node-Bs, relay stations, access points, for example.

User equipment may refer to any user communication device. A term "user equipment" as used herein may refer to any device having a communication capability, such as a wireless mobile terminal, a PDA, a smart phone, a personal computer (PC), a laptop computer, a desktop computer, etc. For example, the wireless communication terminal may be an UMTS (Universal Mobile Telecommunications System) or GSM/EDGE (Enhanced Data Rates for GSM Evolution) smart mobile terminal having S60 operating system from Nokia Corporation. Thus, the application capabilities of the device according to various embodiments of the invention may include native S60 applications available in the terminal, or subsequently installed applications.

The connections shown in the Figures, describing one or more apparatuses according to the present invention, are logical connections; the actual physical connections may be different. It is apparent to a person skilled in the art that the systems also comprise other functions and structures. Different blocks in the apparatuses may be combined and implemented in single physical or logical entities. It should be appreciated that different blocks in the Figures may also be divided and implemented in one or more physical or logical entities.

FIG. 1 shows an embodiment of a radio device 100. The device may be a mobile phone, computer, a laptop, or a PDA (Personal Digital Assistant), for instance. The device 100 may also be a combination of two electronic devices, such as a computer and a mobile phone connected to the computer. An example of a combination of a PDA and a mobile communication device is the Nokia Communicator.

The device 100 may comprise one or more communication interfaces (radio devices) 110 to 114 to provide a wireless radio connection. The communication interface may be configured to receive and transmit signals using the wireless radio connection. Accordingly the device and the interfaces may operate as radio receivers and/or transmitters. The communication interfaces 110 to 114 may be configured to provide connections employing different radio access technologies. In our example, the communication interface 110 provides a communication link 116 with a GSM system through a serving GSM base transceiver station 122. The communication interface 114 provides a WLAN connection 118 with a serving WLAN access point 124. A communication interface 112 provides another wireless connection 120, using Bluetooth technology, with a device 106.

The communication interfaces 110 to 114 described above may share at least partially the same components of the device 100 during the operation of radio connections 116 to 120. The communication interfaces 110 to 114 use for example the same antenna or antennas, radio frequency amplifier, and/or radio frequency filter. Each communication interface 110 to 114 may alternatively have its own components or only some of the communication interfaces 110 to 114 may use the same components.

In the example of FIG. 1, three communication interfaces 110 to 114 are provided in the device, these interfaces 110 to 114 providing the Bluetooth connection 120, the GSM connection 116, and the WLAN connection 118, respectively. It should, however, be appreciated that the device is limited neither to the number of communication interfaces in the device nor to the wireless communication technology the communication interfaces provide. Thus, the device may comprise one or more communication interfaces providing connections based on, for example, but not limited to, the following technologies: GSM, WLAN, WIMAX (Worldwide Interoperability for Microwave Access), Bluetooth, WCDMA (Wideband Code Division Multiple Access), LTE (Long Term Evolution), GPRS (General Packet Radio Service), EDGE (Enhanced Data Rates for GSM Evolution), DVB-H (Digital Video Broadcasting for Handheld devices), UWB (Ultra Wideband), GPS (Global Positioning System), Galileo, FM (Frequency-Modulated)-radio, CDMA2000, television receivers, AM (Amplitude Modulation) receivers, military radios, shortwave receivers. Other wireless communication technologies may also be implemented in the device.

The device 100 further comprises a control unit 104 to control the functions of the device 100. The control unit 104 comprises means for creating radio connections between the device 100 and other devices or networks. The control unit 104 also comprises means for controlling a number of simultaneous radio connections in the device 100.

The device 100 further comprises a memory 126 for storing data and/or instructions. The memory may store for example a computer program comprising instructions for controlling the control unit and/or the interfaces.

The control unit 104 and the communication interfaces 110-114 may be implemented with a digital signal processor with suitable software or with separate logic circuits, for example with ASIC (Application Specific Integrated Circuit). The control unit 104 and the communication interfaces 110-114 may also be a combination of these two implementations, such as a processor with suitable software embedded within an ASIC.

Figure 2:
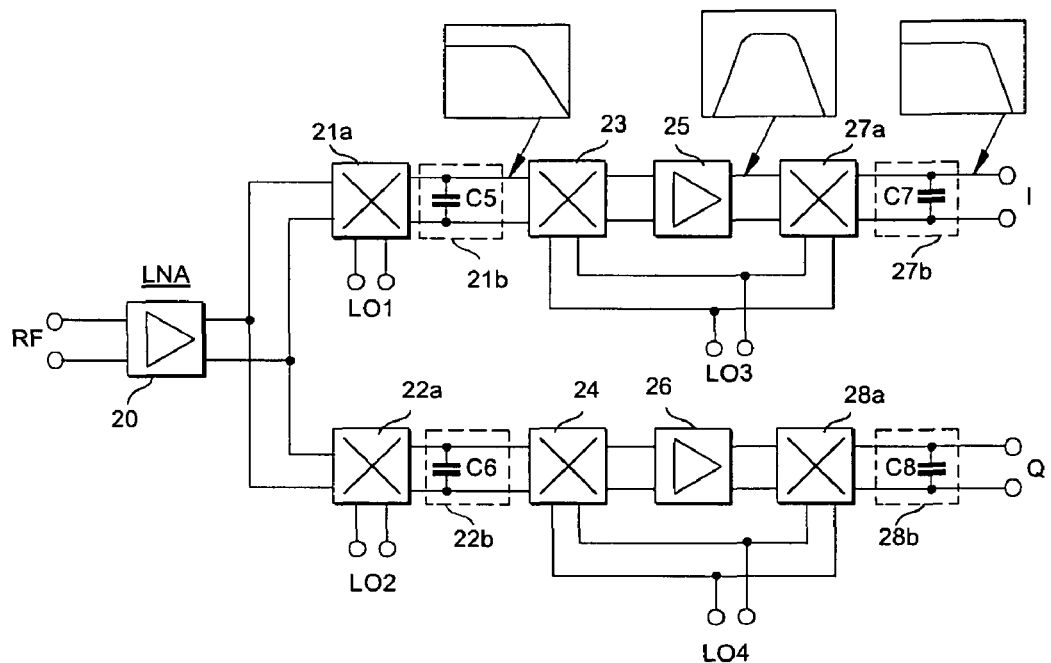
FIG. 2 illustrates an exemplary block diagram of an apparatus for receiving according to an embodiment of the invention.
Figure 2:
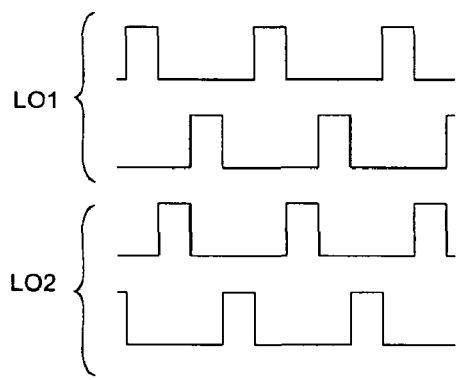
Figure 2:
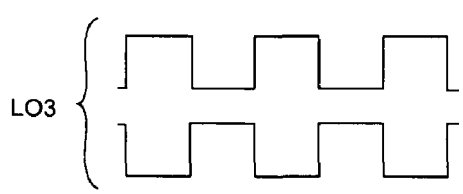
Figure 2:
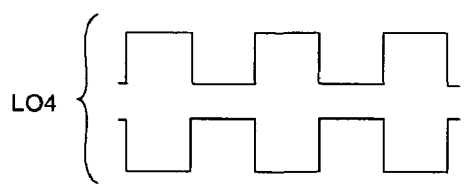
Figure 3:
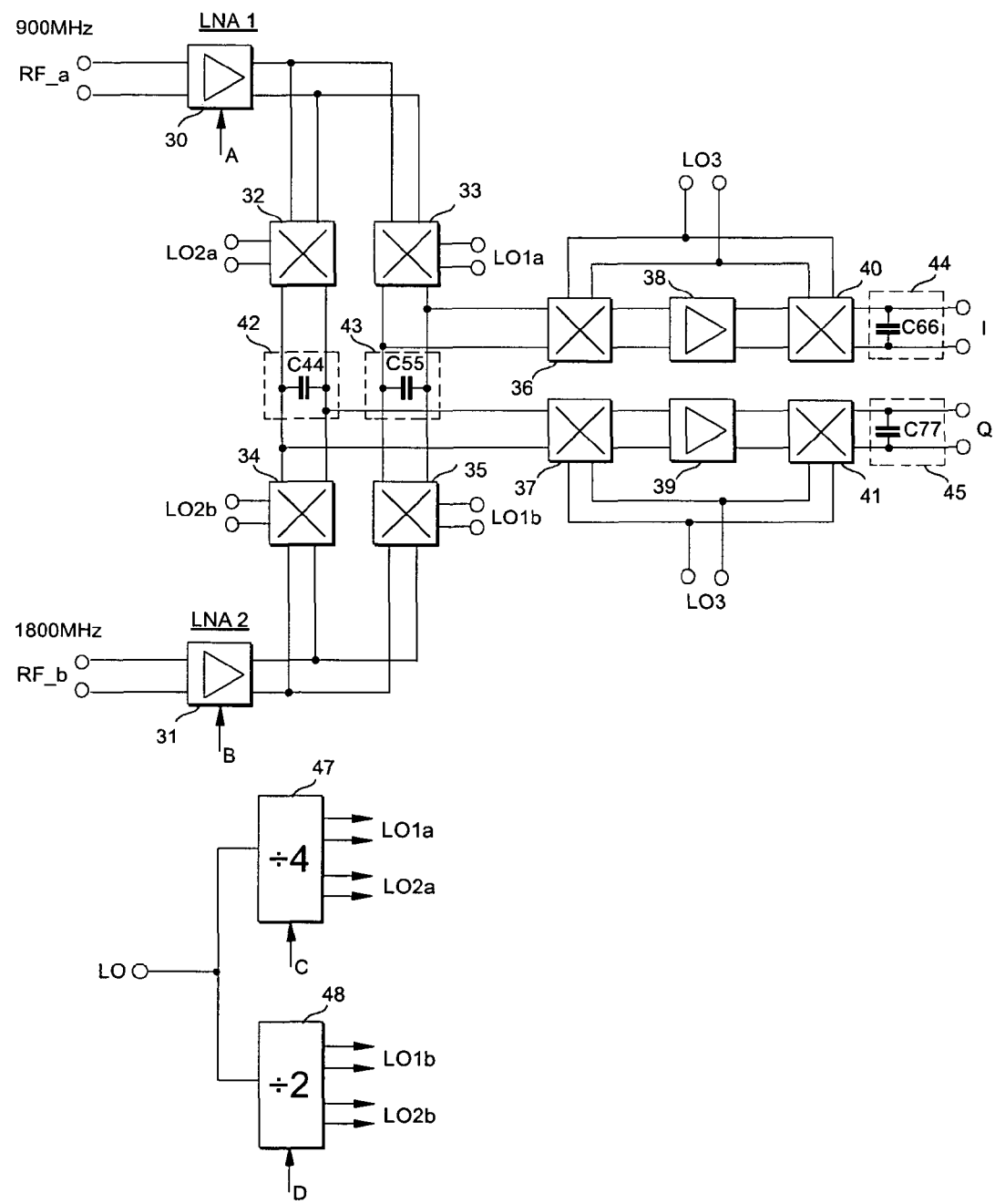
FIG. 3 illustrates an exemplary block diagram of an apparatus for receiving signals on two or more frequency bands according to an embodiment of the invention.

In FIGS. 2 and 3 illustrate exemplary block diagrams of an apparatus according to embodiments of the present invention. The illustrated exemplary embodiments employ balanced mixers. However, it should be appreciated that the exemplary embodiments are not restricted only to balanced mixers, but also other types of mixers such as unbalanced mixers may be used. The illustrated block diagrams of an apparatus in the FIGS. 2 and 3 may represent a radio device or a part of a radio device such as the radio device illustrate in FIG. 1. The radio device may be a radio receiver configured to receive an RF signal.

The RF signal may comprise at least one channel to be received by the radio device. The channel may be received on a frequency band having a range of frequencies between a lowest and a highest frequency of the band. The channel may be the only channel on the frequency band, or there may be a plurality of channels on the frequency band. Accordingly, the bandwidth of the channel may be defined as the frequency band between the highest and lowest frequency. The channel may be used to carry information such as one or more bits, bytes, data and/or voice. The channel may be a dedicated channel or a common channel. Accordingly, the channel may carry only information to be received by the radio device and/or the channel may comprise information to be received also by other radio devices.

For example, the channel may be a downlink channel in a GSM 800 MHz, 900 MHz, 1800 MHz, 1900 MHz frequency bands, which are common frequency bands used in GSM systems. In the example, the frequency band comprises a plurality of downlink channels separated by 200 kHz. Accordingly, the center frequencies of the channels may be separated by the channel separation of 200 KHz. The channel may also be a channel of a system according to any of the above mentioned technologies. Accordingly, the frequency band of the channel may be determined by the used technology.

A local oscillator signal may be characterized by the frequency and the pulse ratio of the signal. The local oscillator signal may be generated within the radio device or the local oscillator signal may be provided to the radio device from an external source. In one example the local oscillator signal to the radio device may be derived from a clock signal of an AD (analog-to-digital) converter. In another example the local oscillator signal may be generated in frequency synthesizer.

Referring now to FIG. 2, the RF signal may be amplified using an LNA (Low-Noise Amplifier) 20. The LNA may operate on the frequency band comprising the one or more channels to be received. The RF signal may be received for amplification in the LNA from an antenna as illustrated in FIG. 1, for example. The LNA amplifies the received frequency band with a gain that is a characteristic to the LNA. The gain may be constant over the received frequency band or the gain may vary with frequency, for example due to the non-linearity of the LNA. Accordingly, the LNA may amplify the received frequencies in the frequency band by the gain determined for each frequency in the LNA. The uppermost items in FIG. 2, illustrate exemplary frequency responses of the received signal from the LNA to a specific point.

The radio device may comprise two receiver branches for processing the received RF signal. The two branches may correspond to an in-phase (I) and a quadrature phase (Q) branches, or the branches may have some other phase difference. After the LNA, the signal path of the received RF signal may be separated into the two branches, as can be seen in FIG. 2, where the signal from the LNA is fed to a mixer 21a in the I branch and to a mixer 22a in the Q branch. Accordingly, the mixer 21a may be configured to separate the received RF signal to the I branch and the mixer 22a may be configured to separate the received RF signal to the Q branch.

In an exemplary embodiment, the mixers 21a and 22a may be configured to operate as down-converters, thereby shifting the received RF signal from the LNA into a lower frequency band. The lower frequency band may be defined by the local oscillator signal received in the mixers and used to mix the received RF signal. The lower frequency band may comprise a baseband or an intermediate frequency band, for example.

A baseband may be defined by a range of frequencies measured from zero or very close to zero to a maximum bandwidth or highest signal frequency in the received signal.

Local oscillator signal 1 (LO1) may be provided as input to the mixer 21a and a local oscillator signal 2 (LO2) may be provided as input to the mixer 22a. The mixers are configured to provide as output a signal at a frequency band that is a linear combination of the local oscillator signal and the received RF signal provided in the mixer.

Examples of LO1 and LO2 are illustrated in FIG. 2. As can be seen, the frequencies of LO1 and LO2 may be the same. As a difference between LO1 and LO2 in FIG. 2, LO1 and LO2 have a 90 degree phase difference. Accordingly, LO1 may be considered as the in-phase of LO1 and LO2 may be considered as quadrature phase of LO1. Thus LO2 may be out-of-phase from LO1. The phase difference between the local oscillator signals LO1 and LO2 provided to mixers 21a and 22a enable separating the received RF signal into I and Q components. Accordingly, the mixers may separate the I and Q components into respective a low-frequency signals having different phases.

In an exemplary embodiment, the frequencies of the LO1 and LO2 may be determined as the center frequency of the channel in the received RF signal. When the frequency of LO1 and LO2 is the center frequency of the channel, the mixer 21a may be configured to provide an in-phase component of the channel on the baseband frequency, and mixer 22a may be configured to provide a quadrature phase component of the channel on the baseband frequency.

In an exemplary embodiment the frequencies of the LO1 and LO2 may be determined such that the mixer 21a may provide the in-phase component of the channel and the mixer 22a may provide the quadrature phase component of the channel on an intermediate frequency.

In the exemplary embodiment illustrated in FIG. 2, the mixers 21a and 22a are balanced mixers. Accordingly, LO1 may be provided to the mixer 21a in two opposite phases, thus separated by a phase difference of 180 degrees. Similar to mixer 21a and LO1, mixer 22a may also be provided the LO2 in two opposite phases. As can be seen in FIG. 2, the all the phases of LO1 have a 90 degree phase difference to different phases of LO2, as is required for separating I and Q components of the RF signal. This may be achieved when the pulse ratio of the LO1 and LO2 is defined as 25/75. Thus, with a pulse ratio 25/75, the voltage is high 25 percent of the cycle time in the local oscillator signal.

In the I branch of the radio device, the in-phase component provided by the mixer 21a may be filtered in a low-pass filter. Similarly the quadrature phase component provided by the mixer 22a may be filtered in a low-pass filter. A low-pass filter may be implemented with one or more capacitance and resistance. The low pass filter may be passive or active, thus in the latter case the low-pass filter may amplify the filtered signal. Capacitance C5 21b illustrates a low-pass filter that is configured to filter the in-phase component received from the mixer 21a and capacitance C6 illustrates a low-pass filter that is configured to filter the quadrature phase component received from the mixer 22a. Accordingly, the passband and stop-band frequencies of the filters may be adapted to the bandwidth of the received channel. In this way the frequencies outside the frequency band of the channel may be substantially attenuated. Thereby, noise and/or interference outside the frequency band of the channel may be substantially attenuated or removed. An exemplary frequency response of the filtered in-phase component from the LNA to output of the capacitance C5 is illustrated above the capacitance C5. The frequency response of the quadrature phase component after the capacitance C6 may be substantially similar to the frequency response after the capacitance C5 in the I branch.

In an exemplary embodiment the mixer 21a and/or mixer 22a may include a low-pass filter. Accordingly, when the low-pass filter is incorporated in the mixer, the mixer may perform low-pass filtering at the same time with mixing the received RF signal into the lower frequency, for example an intermediate or baseband frequency. In this way the number of components in the radio device may be reduced.

After the in-phase phase component has been separated by the mixer 21a and the possible filtering in a low-pass filter, the in-phase component may be fed to a mixer 23. In a similar way, the quadrature phase component separated by the mixer 22a may be fed to mixer 24.

In an exemplary embodiment, in the I branch, the mixer 23 may be configured to operate as an up-converter, thereby shifting the separated in-phase component to the frequency band of an amplifier 25. Similarly, in the Q branch, the mixer 24 may be configured to operate as an up-converter, thereby shifting the separated quadrature phase component to the frequency band of an amplifier 26. Accordingly, the mixers may up-convert the separated in-phase component and quadrature phase component to respective intermediate frequency signals on respective intermediate frequency bands.

A local oscillator signal 3 (LO3) may be provided as input to the mixer 23 and a local oscillator signal 4 (LO4) may be provided as input to the mixer 24. The frequency of the LO3 may be selected such that, when LO3 is provided to mixer 23 and used to mix the in-phase component at the lower frequency band, the linear combination of the frequencies of the in-phase component and the LO3 causes the in-phase component to shift to a higher frequency band, where the amplifier provides amplification. Accordingly, the higher frequency band may match to the frequency band of amplification of the amplifier 25. An exemplary frequency response of the amplified in-phase component from the LNA to output of the amplifier 25 is illustrated above the amplifier 25. The frequency response of the amplified quadrature phase component after the amplifier 26 may be substantially similar to the frequency response of the amplified in-phase component.

The frequency of LO4 may be selected in a similar manner as LO3. Accordingly, when the quadrature phase component on the lower frequency band is mixed with LO4 in the mixer 24, the quadrature phase component may be shifted to a higher frequency, where the amplifier 26 provides amplification. Thus, the higher frequency band may match to the frequency band of amplification of the amplifier 26.

As is illustrated in FIG. 2, the LO3 and LO4 may have the same frequency and the same phase. It should be appreciated that the phases of LO3 and LO4 may be substantially the same. This is because the mixers 21a and 23 have introduced a 90 degree phase difference between the I and Q branches, when separating the in-phases and quadrature phase components.

Furthermore, it should be appreciated that the frequency of LO3 and LO4 may be different than the frequency used in LO1 and/or LO2. Accordingly, the frequency of LO3 may be selected, on the basis of the frequency band of amplification of the amplifier 25, and the frequency of LO4 may be selected, on the basis of the frequency band of amplification of the amplifier 26, as described above. In this way, amplifiers 25 and 26 may be designed so that they have good noise properties, for example high stop-band attenuation and/or low noise figure. Furthermore, the frequencies of LO3 and LO4 may be selected such that they are easy to form.

Furthermore, due to separating the in-phase and quadrature components in the mixers 21a and 22a, the pulse ratio of LO3 and LO4 may be different than the pulse ratio used in LO1 and/or LO2.

The amplifier 25 provides the amplified in-phase component to mixer 27a and the amplifier 26 provides the amplified in-phase component to mixer 28a. The mixers 27a and 28a may be configured to operate as down converters, thereby mixing the received signal to a lower frequency band from the frequency bands of the amplifiers so as to provide the amplified in-phase and quadrature phase components on a lower frequency band.

In an exemplary embodiment, the mixer 27a may be provided with the LO3 and the mixer 28a may be provided with the LO4. When the LO3 is used to mix the amplified in-phase component, the in-phase component may be mixed back to the lower frequency band. The lower frequency band may be substantially the same band, where the in-phase component was before mixing the in-phase component with the mixer 23a. In a similar manner, when the LO4 is used to mix the amplified quadrature phase component, the quadrature phase component may be mixed back to the lower frequency band. The lower frequency band may be substantially the same band, where the quadrature phase component was before mixing the quadrature phase component with the mixer 24a.

In the I branch of the radio device, the in-phase component provided by the mixer 27a may be filtered in a low-pass filter. Similarly, in the Q branch, the quadrature phase component provided by the mixer 28a may be filtered in a low-pass filter. A low-pass filter may be implemented with one or more capacitance and resistance. The low pass filter may be passive or active, thus in the latter case the low-pass filter may amplify the filtered signal. Capacitance C7 27b illustrates a low-pass filter that is configured to filter the in-phase component received from the mixer 27a and capacitance C8 illustrates a low-pass filter that is configured to filter the quadrature phase component received from the mixer 28a. Accordingly, the passband and stop-band frequencies of the filters may be adapted to the bandwidth of the received channel. In this way the frequencies outside the frequency band of the channel may be substantially attenuated. Thereby, noise and/or interference outside the frequency band of the channel may be substantially attenuated or removed. An exemplary frequency response of the filtered in-phase component from the LNA to output of the capacitance C7, is illustrated above the capacitance C7. The frequency response of the quadrature phase component after the capacitance C8 may be substantially similar to the frequency response after the capacitance C7 in the I branch.

As can be seen from the frequency responses in FIG. 2, the transitional band between the pass band and stop band is steeper in the frequency response after capacitance C7 than in the frequency response after the capacitance C5. When the transitional band between the pass band and stop band is narrow, the effect of frequencies outside the pass band may be minimized in the received signal. In this way, noise/and interference outside the pass band may be suppressed from the received signal.

In an exemplary embodiment the mixer 27a and/or mixer 28a may include the low-pass filter. Accordingly, when the low-pass filter is incorporated in the mixer, the mixer may perform low-pass filtering at the same time with mixing the received RF signal into the lower frequency, for example an intermediate or baseband frequency. In this way the number of components in the radio device may be reduced.

Referring now to FIG. 3 that illustrates a block diagram of a radio device for receiving two channels on a different frequency bands. The exemplary embodiment illustrated in FIG. 3 may be use in a mobile phone operating in two or more different frequency bands. In the example of FIG. 3, the radio device may receive one channel on the GSM system 900 Mhz frequency band and another channel on GSM system 1800 MHz frequency band. However, the channel may also be a channel of a system according to any of the above mentioned technologies. Accordingly, the frequency band of the channel may be determined by the used technology.

In the exemplary embodiment, each of the received frequency bands may be amplified in respective amplifiers 30 and 31. The amplifiers may be LNAs such as the LNA in FIG. 2. However, in FIG. 3 the LNA 30 is configured to amplify a different frequency band than the LNA 31. As illustrated in FIG. 3, the LNA 30 may be configured to amplify the 900 MHz GSM system frequency band, and the LNA 31 may be configured to amplify the 1800 MHz GSM system frequency band.

Similar to FIG. 2, the radio device in FIG. 3 comprises two receiver branches for processing the received RF signal. The branches may correspond to an I and a Q branch. Mixers 32 and 33 may be configured to separate the RF signal received on the GSM 900 MHz frequency band to the I and Q branches. Mixers 34 and 35 may be configured to separate the RF signal received on the GSM 1800 MHz frequency band to the I and Q branches. Thus each of the frequency bands has separate mixers for separating the received RF signal to the I and Q branch.

The operation of mixers 33 and 35 may be similar to the operation of mixer 21a as described above and the operation of mixers 32 and 34 may be similar to the operation of the mixer 22a as described above. The local oscillator signals LO1a and LO1b correspond to LO1 in FIG. 2. The local oscillator signals LO2a and LO2b correspond to LO2 in FIG. 2. In the exemplary embodiment described in FIG. 3, local oscillator signals LO1a and LO2a have a frequency adapted to the GSM 900 MHz frequency band. Similarly, local oscillator signals LO1b and LO2b have a frequency adapted to the GSM 1800 MHz frequency band.

In an exemplary embodiment, the frequencies of the LO1a and LO2a may be determined as the center frequency of the channel in the GSM 900 MHz frequency band. When the frequency of LO1a and LO2a is the center frequency of the channel, the mixer 33 may be configured to provide an in-phase component of the channel on the baseband frequency, and mixer 32 may be configured to provide a quadrature phase component of the channel on the baseband frequency.

The frequencies of LO1b and LO2b may be determined similar to LO1a and LO2a, however, the center frequency of the channel now being a frequency in the GSM 1800 MHz frequency band.

In an exemplary embodiment the frequencies of the LO1a and LO2a may be determined such that the mixers 33 and 32 may provide the in-phase component and the quadrature phase component of the channel on an intermediate frequency. The frequencies of LO2b and LO2b may also be selected in a similar way.

In the radio device a switch 47, 48 may be provided for selecting between a channel on the GSM 900 MHz frequency band and a channel on the GSM 1800 MHz frequency band. The selecting between channels on different frequency bands may be performed using the local oscillator signals LO1a, LO2a, LO1b and LO2b that may be provided as input to the switch. Selecting may comprise switching-off blocks if they are not needed. For example, if the channel on the GSM 900 MHz frequency band is selected, the mixers 34 and 35 providing the channel on the GSM 1800 MHz frequency band may be switched-off, as the frequency band is not needed. Furthermore, the switch may be configured to switch-off the LNA 31. In a similar way mixers 32 and 33 and LNA 30 may be switched off.

In FIG. 3, the switch may be exemplified with two frequency dividers 47 and 48. A local oscillator signal may be provided as input to the frequency dividers. The frequency of the local oscillator signal LO may be at least double the frequency of the channel in the received RF signal. In this example the frequency of the LO may be 3600 MHz. The frequency divider 47 may divide the frequency of the LO with 4 and the frequency divider 47 may thereby provide LO1a and LO2a having a frequency of 900 MHz. The frequency divider 48 may divide the frequency of the LO with 2 and thereby provide LO1b and LO2b having a frequency of 1800 MHz. In this way local oscillator signals LO1a, LO2a, LO1b and LO2b may be generated to the mixers for down-converting a channel on the 900 MHz or 1800 MHz frequency band in the received RF signal.

The frequency divider 47 may be controlled with a control signal 'C' and the frequency divider 48 may be controlled with a control signal 'D'. The frequency dividers may be configured to switch on and off as controlled by the respective control signals they receive. In one example the control signals 'C' and 'D' may correspond to operation voltages of the frequency dividers. Thus, the operation voltages of each frequency divider may be switched on or off so as to control the selection of frequency bands. In another example, each of the control signals may be a single bit. For example, when the control signal 'C' is '1', the frequency divider 47 may be switched on and the LO1a and LO2a may be provided to mixers 32 and 33. When the control signal 'D' is '1' the frequency divider 48 may be switched on and the LO1b and LO2b may be provided to mixers 34 and 35. When 'C' is '0' the frequency divider 47 may be switched off and when 'D' is '0' the frequency divider 48 may be switched off. In this way the mixers that are not provided local oscillator signals may be switched-off, while the mixers receiving the local oscillator signals may be operative. In a similar way, a control signal 'A' may be fed to the LNA 30 and a control signal 'B' may be fed to the LNA 31, so that the LNA 30 may be switched-on when the control signal 'A' is '1', and the LNA 31 may be switched on when the control signal 'B' is '1'. Accordingly, with control signals 'A' and 'C' switching on the LNA 30 and mixers 32 and 33, the frequency band of 900 MHz may be selected. In a similar way with control signals 'B' and 'D' the frequency band of 1800 MHz may be selected. When blocks may be switched-off, power may be saved.

The down converted RF signal from the mixers 32 to 35 may be filtered in low-pass filters in a similar way to FIG. 2. Accordingly, the down converted signal from Q branch mixers 32 and 34 be filtered by a capacitance C44 42 and the down converted signal from 1 branch mixers 33 and 35 may be filtered by a capacitance C55 43.

The operation of mixer 36, amplifier 38, mixer 40 and capacitance 44 in the I branch of the radio device in FIG. 3 correspond to the mixer 23, amplifier 25, mixer 27a and capacitance 27b in FIG. 2. In a similar manner the operation of mixer 37, amplifier 39, mixer 41 and capacitance 45 in the I branch of the radio device in FIG. 3 correspond to the mixer 24, amplifier 26, mixer 28a and capacitance 28b in FIG. 2.

It should be appreciated that the frequency dividers described above with reference to FIG. 3 may also be employed in the exemplary embodiment illustrated in FIG. 2 for providing local oscillator signals to the mixers. For example, employing the frequency dividers in the exemplary embodiment of FIG. 2, the LO of 1800 MHz may be provided to a frequency divider, thereby providing LO1 and LO2 with a frequency 900 MHz, similar to FIG. 3, where a channel at 900 MHz frequency band is received. Then, the LO3 and LO4 may be derived from the 900 MHz LO1 or LO2 by diving with 4, thereby providing LO3 and LO4 with a frequency of 225 MHz.

It should be appreciated that exemplary embodiments of the present invention may provide a band pass filter with a narrow bandwidth. For example, referring to FIG. 2, the band pass filter may be provided by the mixers 23 and 21a and low-pass filter 21b in the I branch of the receiver. However the band pass filter may comprise also other blocks of the I branch that illustrated in FIG. 2. Similarly, referring to FIG. 2, the band pass filter may be provided by the mixers 24 and 22a and low-pass filter 22b in the Q branch of the receiver, and comprise also other blocks that are illustrated in FIG. 2 in the Q branch.

It should be appreciated that MOSFET (metal-oxide-semiconductor field-effect transistor) transistors may be used in implementations of the above exemplary embodiments. The MOSFETs may be used in the mixers, for example. An ideal MOSFET may have an infinite resistance when turned off and zero resistance when turned on, called ON-resistance. However, the size of the MOSFET increases with decreasing ON-resistance. As can be seen in FIGS. 2 and 3, the mixers are not connected in series with the capacitances operating as filters. Therefore, in the exemplary embodiments, MOSFETs that are switched on affect the pass-band and stop-band frequencies of the filters in a substantially similar way. Accordingly, the MOSFETs and their properties such as the ON-resistance, may be selected such that the size of the MOSFET may be small. In this way the area consumed by the MOSFETs on an integrated circuit may also be kept small.

It should be appreciated that the above exemplary embodiments may provide reduction of noise and/or interference for example in duplex systems, where a transmitter and a receiver in a radio device connect to a single antenna as separated by a duplex filter. One example of a duplex system may be a WCDMA FDD system, where a mobile phone may transmit and receive at the same time, but at different frequencies.

It should be appreciated that the above exemplary embodiments may provide reduction of noise and/or interference in radio devices that employ multiple transmitters and/or receivers that may interfere with each other. Such radio devices may be mobile phones that have WLAN, WCDMA, GSM and Bluetooth radio radios implemented in the same device. In such devices transmission on one radio may cause interference in reception on another radio.

The apparatus 100, the radio devices 110 to 114 may be implemented as any kind of processor programmable to execute numeric calculations such as an embedded processor, a Digital Signal Processor (DSP), a Master Control Unit (MCU) or an Application Specific Integrated Processor (ASIP). The apparatus and radio devices may also be implemented as an electronic digital computer, which may comprise a working memory (RAM), a central processing unit (CPU) or a processor, and a system clock. The CPU may comprise a set of registers, an arithmetic logic unit, and a control unit. The control unit is controlled by a sequence of program instructions transferred to the CPU from the RAM. The control unit may contain a number of microinstructions for basic operations. The implementation of microinstructions may vary, depending on the CPU design. The program instructions may be coded by a programming language, which may be a high-level programming language, such as C, Java, etc., or a low-level programming language, such as a machine language, or an assembler. The electronic digital computer may also have an operating system, which may provide system services to a computer program written with the program instructions.

An embodiment provides a computer program embodied on a distribution medium, comprising program instructions which, when loaded into an electronic apparatus, constitute apparatus 100 and/or the radio devices 110-114 described earlier.

The computer program may be in source code form, object code form, or in some intermediate form, and it may be stored in some sort of carrier, which may be any entity or device capable of carrying the program. Such carriers include a record medium, computer memory, read-only memory, electrical carrier signal, telecommunications signal, and software distribution package, for example. Depending on the processing power needed, the computer program may be executed in a single electronic digital computer or processor or it may be distributed amongst a number of computers or processors.

The steps/points and related functions described above in FIGS. 2 and 3 are in no absolute chronological order, and some of the steps/points may be performed simultaneously or in an order differing from the given one. Other functions can also be executed between the steps/points or within the steps/points and other signaling messages sent between the illustrated messages. Some of the steps/points or part of the steps/points can also be left out or replaced by a corresponding step/point or part of the step/point. The FIGS. 2 and 3, illustrate procedures that may be implemented in one or more physical or logical entities.

The techniques described herein may be implemented by various means so that an apparatus implementing one or more functions of a radio device described with an embodiment comprises not only prior art means, but also means for implementing the one or more functions of a corresponding apparatus described with an embodiment and it may comprise separate means for each separate function, or means may be configured to perform two or more functions. For example, these techniques may be implemented in hardware (one or more apparatuses), firmware (one or more apparatuses), software (one or more modules), or combinations thereof. For a firmware or software, implementation can be through modules (e.g., procedures, functions, and so on) that perform the functions described herein. The software codes may be stored in any suitable, processor/computer-readable data storage medium(s) or memory unit(s) or article(s) of manufacture and executed by one or more processors/computers. The data storage medium or the memory unit may be implemented within the processor/computer or external to the processor/computer, in which case it can be communicatively coupled to the processor/computer via various means as is known in the art.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

I claim:

1. An apparatus, comprising:
a processor configured to separate from a received radio frequency signal a first low-frequency signal and a second low-frequency signal having different phases, to up-convert the first low-frequency signal and the second low-frequency signal into a first intermediate frequency signal and a second intermediate frequency signal, respectively, to amplify the first and the second intermediate-frequency signals, and to down-convert the amplified first and second intermediate-frequency signals into a third low-frequency signal and a fourth low-frequency signal, respectively.

2. An apparatus according to claim 1, wherein said received radio frequency signal comprises an in-phase component and a quadrature phase component.

3. An apparatus according to claim 1, wherein the received radio frequency signal comprises a first frequency band signal and a second frequency band signal, and wherein the processor is further configured to selectively down-convert one of said first and second frequency band signals into said first and said second low-frequency signal.

4. An apparatus according to claim 1, wherein the apparatus comprises one or more of the group comprising an integrated circuit, a user equipment, a terminal, and a mobile phone.

5. An apparatus according to claim 1, further comprising:
a first low-pass filter configured to receive and filter one or more of the signals comprising the first low-frequency signal, the second low-frequency signal, the third low-frequency signal, and the fourth low-frequency signal.

6. An apparatus according to claim 1,
wherein the processor is further configured to receive a radio frequency signal comprising a first channel on a first frequency band, and
wherein the apparatus further comprises:
a first receiver branch comprising
a first mixer configured to mix the received first channel with a first local oscillator signal having a first phase, and provide an in-phase component of the first channel as the first low-frequency signal,
a second mixer configured to mix the first low-frequency signal with a second local oscillator signal into the first intermediate frequency signal on a first intermediate frequency band, and
a first amplifier configured to amplify the first intermediate frequency signal, wherein the second local oscillator signal being selected such that the first intermediate frequency band matches to a frequency band of the first amplifier; and
a second receiver branch comprising
a third mixer configured to mix the received first channel with the first local oscillator signal having a second phase, and provide an out-of phase component of the first channel as the second low-frequency signal,
a fourth mixer configured to mix the second low-frequency signal with a third local oscillator signal into the second intermediate frequency signal on a second intermediate frequency band, and
a second amplifier configured to amplify the second intermediate frequency signal, wherein the third local oscillator signal being selected such that the second intermediate frequency band matches to a frequency band of the second amplifier.

7. An apparatus according to claim 6, wherein the apparatus further comprises:
a fifth mixer configured to mix the amplified first intermediate frequency signal with the second local oscillator signal to a first lower frequency band; and
a sixth mixer configured to mix the amplified second intermediate frequency signal with the third local oscillator signal to a second lower frequency band.

8. An apparatus according to claim 6, wherein the processor is further configured to determine the frequency of the first local oscillator as the center frequency of the first channel in the received radio frequency signal.

9. An apparatus according to claim 6, wherein the second local oscillator signal and the third local oscillator signal are the same.

10. An apparatus according to claim 6, wherein the first local oscillator signal operates as the second and the third local oscillator signal.

11. An apparatus according to claim 6,
wherein the radio frequency signal further comprises a second channel on a second frequency band,
wherein the first receiver branch further comprises
a seventh mixer configured to mix the received second channel with a fourth local oscillator signal having a first phase, and provide an in-phase component of the second channel as the first low-frequency signal,
wherein the second receiver branch further comprises
an eighth mixer configured to mix the received second channel with the fourth local oscillator signal having a second phase, and provide an out-of phase component of the second channel as the second low-frequency signal, and
wherein the apparatus further comprises a switch configured to select between the first and the second channel to provide the first and the second low-frequency signals.

12. An apparatus according to claim 11, wherein the switch is configured to connect the first local oscillator signal to the first and the second mixer if the first channel is selected, and connect the fourth local oscillator signal to the seventh and the eighth mixer if the second channel is selected.

13. An apparatus, comprising:
separating means for separating from a received radio frequency signal a first low-frequency signal and a second low-frequency signal having different phases;
up-converting means for up-converting the first low-frequency signal and the second low-frequency signal into a first intermediate frequency signal and a second intermediate frequency signal respectively;
amplifying means for amplifying the first and the second intermediate-frequency signals; and
down-converting the first and second amplified intermediate-frequency signals into a third low-frequency signal and a fourth low-frequency signal, respectively.

14. A non-transitory computer-readable storage medium encoded with instructions configured to control a processor to perform a process, the process comprising:
separating from a received radio frequency signal a first low-frequency signal and a second low-frequency signal having different phases;
up-converting the first low-frequency signal and the second low-frequency signal into a first intermediate frequency signal and a second intermediate frequency signal respectively;
amplifying the first and the second intermediate-frequency signals; and
down-converting the first and second amplified intermediate-frequency signals into a third low-frequency signal and a fourth low-frequency signal, respectively.

15. A computer-readable storage medium according to claim 14, wherein the received radio frequency signal comprises a first frequency band signal and a second frequency band signal, and wherein the process further comprises selectively down-converting one of said first and second frequency band signals into said first and said second low-frequency signal.

16. A method, comprising:
- separating, by a processor, from a received radio frequency signal a first low-frequency signal and a second low-frequency signal having different phases;
- up-converting, by the processor, the first low-frequency signal and the second low-frequency signal into a first intermediate frequency signal and a second intermediate frequency signal respectively;
- amplifying, by the processor, the first and the second intermediate-frequency signals; and
- down-converting the first and second amplified intermediate-frequency signals into a third low-frequency signal and a fourth low-frequency signal, respectively.

17. A method according to claim 16, wherein said received radio frequency signal comprises an in-phase component and a quadrature phase component.

18. A method according to claim 16, wherein the received radio frequency signal comprises a first frequency band signal and a second frequency band signal, and wherein the method further comprises selectively down-converting one of said first and second frequency band signals into said first and said second low-frequency signal.

* * * * *